(12) United States Patent
Longway et al.

(10) Patent No.: US 6,925,627 B1
(45) Date of Patent: Aug. 2, 2005

(54) METHOD AND APPARATUS FOR POWER ROUTING IN AN INTEGRATED CIRCUIT

(75) Inventors: Charles W. Longway, Las Flores, CA (US); Ravi Ranjan, Irvine, CA (US); Deval D. Sanghani, Irvine, CA (US); Khosrow Golshan, Laguna Beach, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 276 days.

(21) Appl. No.: 10/325,618

(22) Filed: Dec. 20, 2002

(51) Int. Cl.[7] ............................................. G06F 17/50
(52) U.S. Cl. ............................................................ 716/13
(58) Field of Search ............................ 716/8, 13, 17; 438/129

(56) References Cited

U.S. PATENT DOCUMENTS

| | | | |
|---|---|---|---|
| 6,477,687 B1 * | 11/2002 | Thomas ........................ 716/8 |
| 6,546,538 B1 * | 4/2003 | Rubdi et al. ................... 716/12 |
| 6,560,753 B2 * | 5/2003 | Barney et al. .................. 716/2 |
| 6,564,363 B1 * | 5/2003 | Dahl et al. ..................... 716/11 |
| 6,609,242 B1 * | 8/2003 | Slade ........................... 716/14 |
| 6,701,509 B2 * | 3/2004 | Aggarwal et al. ............. 716/13 |
| 2001/0049813 A1 * | 12/2001 | Chan et al. ..................... 716/8 |
| 2002/0170020 A1 * | 11/2002 | Darden et al. .................. 716/2 |

* cited by examiner

Primary Examiner—Stacy A. Whitmore
(74) Attorney, Agent, or Firm—Hogan & Hartson, LLP

(57) ABSTRACT

A system and method for routing power between circuit blocks in an integrated circuit, such as macros and standard cells. A macro is wrapped in a relatively narrow power interface ring and placed in the integrated circuit such that the lower metal layers of the power interface ring are aligned and in direct contact with the power rails of a standard cell block. A power grid is formed above the macro and the upper metal layers of the power interface ring are coupled to the power grid. The upper power grid is tied either to an outer power bus or directly to power pins in the surrounding I/O ring. Data signals may be routed in the I/O ring space.

17 Claims, 7 Drawing Sheets

METHOD AND APPARATUS FOR POWER ROUTING IN AN INTEGRATED CIRCUIT

FIELD OF THE INVENTION

The present invention relates to integrated circuit design and, more particularly, relates to a method and apparatus for efficient power routing in a platform-based integrated circuit design environment.

BACKGROUND OF THE INVENTION

Platform-based design is becoming a preferred methodology for integrated circuit implementation as the semiconductor industry attempts to keep pace with increasing circuit complexity. The basic idea behind platform-based design is to avoid the need to design a semiconductor chip from scratch. A library of generic blocks or components is defined and designed for easy implementation and reuse as a subcomponent of a complete chip design.

There are several approaches to platform-based integrated circuit design. One approach is the "standard cell" approach. A standard cell comprises a plurality of circuitry components such as resistors, transistors, etc., and has a predefined and uniform geometry and pin layout. Standard cells, in turn, are organized into blocks that carry out particular functions, such as registers or processing. Hence, an engineer may choose a standard cell from a catalog or library of such cells to carry out some desired function. A standard cell has a standardized pin layout and configuration that makes it easily interconnectable with other such cells. While standard cells are typically easier and faster for a designer to lay out and interconnect, they may not be optimized for performance. A "hard macro" (or simply "macro") approach, by contrast, utilizes a circuitry layout that is customized for the particular function that is being carried out. Macros, while optimized for performance and organized into and treated like other blocks, typically have irregular and unpredictable geometry and signal/power pin locations.

Another emerging trend in the semiconductor industry is the system-on-a-chip ("SOC") design methodology which has, as its name implies, the goal of placing many integrated circuits onto a single semiconductor chip to form a fully contained system. Among the many design challenges facing the SOC integrator is the physical placement and routing of the design, a process referred to as "floorplanning". While floorplanning would be easiest if the designer could choose exclusively from a library of standard cells, in reality, it is almost always necessary to use a mix of standard cells and macros. One particularly troublesome aspect of floorplanning is power routing. Because macros contain signal and power pins in irregular locations, while standard cells possess much more regularity, the routing of power among macros and standard cells is often cumbersome and inefficient. Inefficient integration of circuit blocks such as standard cells and macros can make the chip prohibitively large and cause unwanted timing and delay side effects.

One common power routing technique involves routing power busses and signals using channels formed around and between each standard cell or macro. This approach, however, wastes precious die space that could be used for other purposes or even eliminated. Moreover, because channel routing precludes further cell placement in or near the channel, the area devoted to the channel (often between 10 $\mu$m and 50 $\mu$m wide) creates a low density, underutilized region for the active and polycrystalline lower layers. This technique also typically involves use of an additional power bus between the I/O ring and chip core, a practice that is likewise wasteful and can create uneven power distribution for the chip.

SUMMARY OF THE INVENTION

The present invention employs a more robust vertical and lateral power distribution scheme than that seen in the prior art. Wide, sparsely-spaced channels and power busses are replaced by narrower and more densely spaced vertically extending power interface rings that can be placed in direct lateral contact with neighboring standard cell blocks.

In one embodiment of the invention, an integrated circuit having a plurality of conductive layers formed above device layers is provided. A first circuit block has circuitry components formed in the device layers and spaced power rails. A second circuit block is disposed adjacent the first block and surrounded by a power interface ring formed with power taps that directly abut the power rails of the first block to facilitate power routing between the first and second blocks. A power grid is formed in one or more metal layers and connected to the power interface ring to facilitate power routing to the first and second blocks.

Another embodiment of the invention is an integrated circuit having lower conductive layers and upper conductive layers formed above device layers. The circuit includes a standard cell block having circuitry components formed in the device layers and uniformly spaced power rails formed in the lower metal layers, and a macro disposed adjacent the standard cell block and surrounded by a power interface ring that extends from the device layers to the upper metal layers. The power interface ring is formed with power taps that directly abut the power rails of the adjacent standard cell block in the lower metal layers to facilitate power routing between the macro and standard cell block. A power grid is formed in the upper metal layers and connected to the power interface ring to facilitate power routing to the standard cell block and macro.

Another embodiment of the invention is a circuit block configured for placement into an integrated circuit. It includes a device region formed with integrated circuit components and a conductive region formed in a plurality of layers above the device region. A power interface ring surrounds the device region and extends through the conductive region. The ring is configured in at least one layer with outer power taps that are spaced and sized to correspond with the spacing and size of power rails of other circuit blocks, so that the circuit block may be placed in direct abutment with such other circuit blocks without intervening channels and power busses.

Another embodiment of the invention is a method for routing power in an integrated circuit. A circuit block is surrounded with a power interface ring that extends vertically through a plurality of metal layers of the circuit block. Power taps are formed in at least one metal layer of the ring and configured for direct abutment against power rails of an adjacent circuit block. The circuit block and power interface ring are placed in the integrated circuit such that the power taps are in direct abutment with the power rails of an adjacent circuit block. A power grid is routed above the circuit block and coupled to the power interface ring.

Another method for routing power between circuit blocks according to the present invention includes the steps of: wrapping a first circuit block in a relatively narrow power interface ring; placing the first circuit block in the integrated circuit such that relatively lower metal layers of the power interface ring are aligned and in direct contact with power rails of a second circuit block; and forming a power grid above the first circuit block and coupling relatively higher layers of the power interface ring to the power grid.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
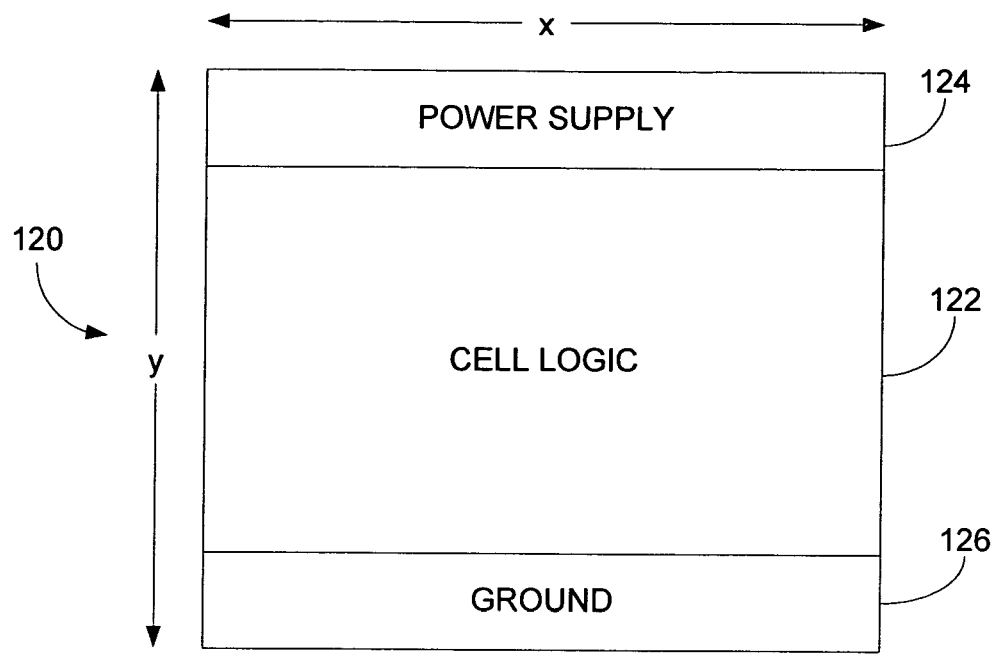
FIG. 1 is a block diagram of a standard cell.

In platform-based integrated circuit design, circuitry is often expressed in terms of a grid or block comprised of a plurality of standard "cells". FIG. 1 illustrates a standard cell 120 having width x and height y. Standard cell 120 is a fundamental design unit for software-based, automated circuit design or "place and route" tools. It comprises logic area 122, power supply area or rail 124, and ground area or rail 126. Circuitry and logic components such as resistors, transistors, diodes, gates, latches, flip-flops and so on are formed in the device layers of logic area 122. The device layers are formed above the substrate and are comprised of polycrystalline, diffusion or active, and implant layers. Conductors connecting the circuitry components are formed in the metal layers above the device layers in area 122. Power supply rail 124 is typically positioned along one edge of cell 120 and delivers a relatively higher voltage from the microchip power supply (not shown) to the components of logic area 122. Ground rail 126 is positioned along the opposite edge of cell 120 and delivers a relatively lower voltage or ground to the cell components. The power and ground rails are typically implemented in the first metal layer ("metal 1") overlying the device layers.

Figure 2:
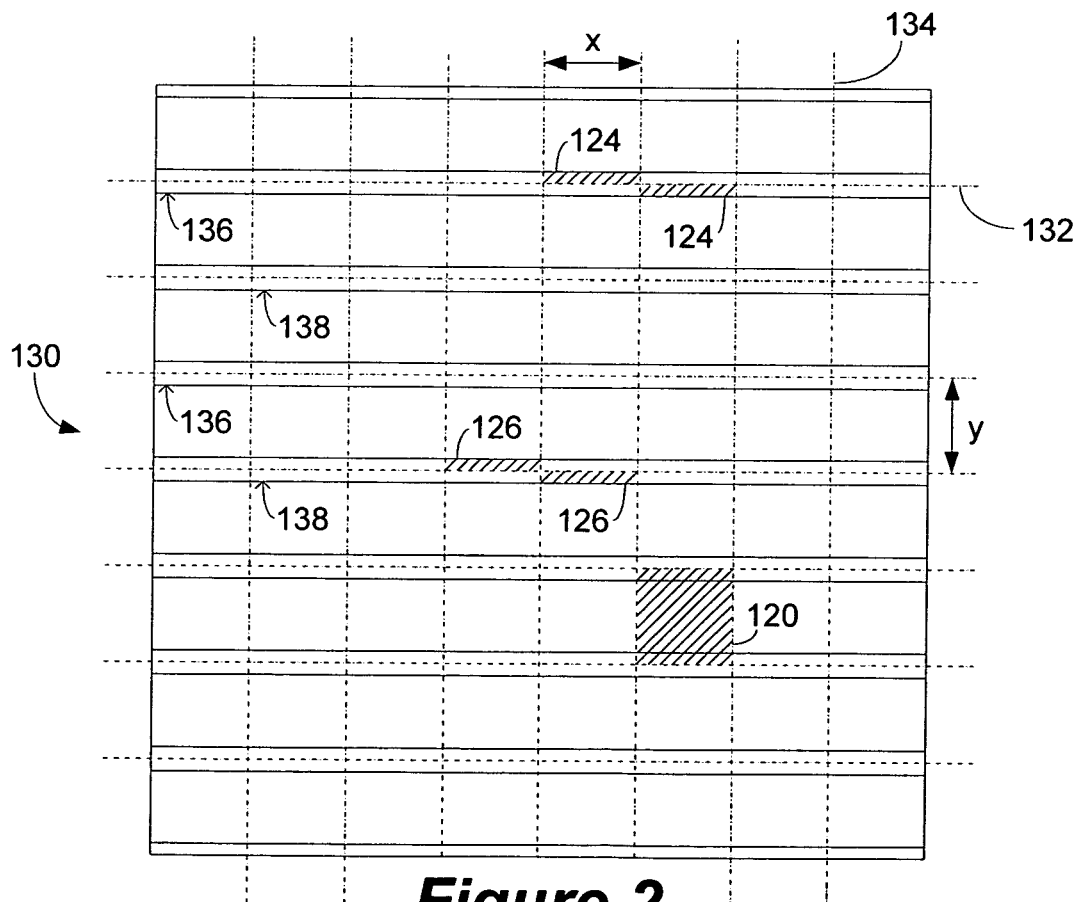
FIG. 2 is a block diagram of a standard cell block.

FIG. 2 is a block diagram of a grid or block 130 formed from a plurality of standard cells 120. The arrangement of cells into blocks with uniform multiples of dimensions facilitates their placement and alignment with other blocks and macros. In FIG. 2, horizontal grid lines 132 and vertical grid lines 134 delineate the individual cells 120 that form block 130. The cells are arranged so that their individual power supplies 124 and grounds 126 abut the power supplies 124 and grounds 126 of adjacent cells, thereby forming continuous power supply rails 136 and ground rails 138 extending horizontally across the entire block 130.

Standard cell grid 130, in addition to facilitating the placement and alignment of blocks and macros to form a microchip core, serves as a power grid for distributing power to the circuitry components of the cell block. If, for example, devices are formed in the logic areas 122 of grid 130, supply rails 136 may act as VDD sources and ground rails 138 may act as VSS sources. In this document, the terms "standard cell grid" and "standard cell power grid" are used interchangeably in reference to the basic configuration of a grid 130 formed from a plurality of standard cells 120 as depicted in FIG. 2.

The x/y dimensions of grid 130 depend on the process technology employed, metal pitch and engineering considerations. A microchip design using 0.15 micron technology, for example, will have a different standard cell size than will a microchip design using 0.13 micron technology. Standard cell grid 130 of FIG. 2, for example, is a square grid measuring 8(x) by 8(y), that is, eight cell units wide by eight cell units high. Other rectangular grid dimensions that conform to the grid dimension a(x) by b(y) are possible, where a and b are non-zero, positive integers. The dimension x, in turn, comprises an integer number of smaller unit dimensions. Hence, the length of x may vary, depending on what integer number of unit dimensions is utilized. In a typical very large scale integration (VLSI) design or SOC substrate layout, the standard cell width is on the order of 0.5 microns and the standard cell height is on the order of five microns. A macro can encompass several hundred thousand unit cells.

Figure 3:
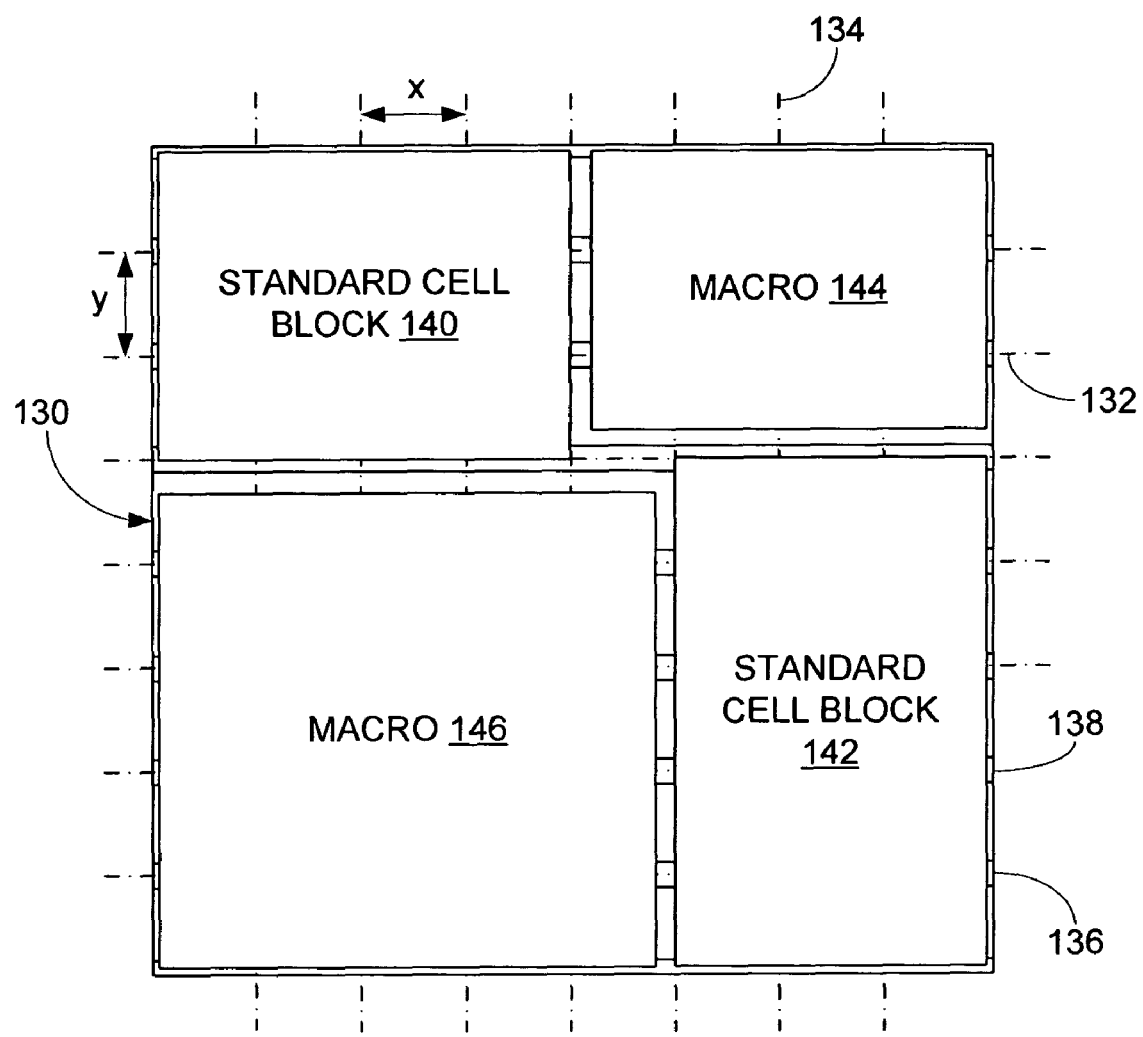
FIG. 3 is a block diagram showing alignment of standard cell blocks and macros relative to a standard cell grid.

FIG. 3 depicts the placement of several standard cell blocks 140, 142 and macros 144, 146 relative to a standard cell power grid 130. As can be seen, while standard cell blocks 140 and 142 span more than one cell 120, they are in alignment with grid lines 132 and 134. Standard cell block 140, for example, encompasses twelve (four cells wide; three cells high) unit cells in the upper left corner of grid 130. A standard cell block is designed with grid placement in mind: its dimensions are an integer multiple of the standard cell size in both the x and y directions. Hence, a standard cell block will measure m(x) by n(y), where n and m are non-zero, positive integers and m<a and n<b (recall from the discussion of FIG. 2 that a is the width in number of unit cells of the entire grid and b is the height in number of unit cells of the entire grid). In this document, the term "standard cell block" refers to a component or circuitry block that is comprised of an integer number of standard cells.

The standardized and predictable dimensions of a standard cell block facilitate the attaching or "snapping" of the cell block to a standard cell grid 130 during automated design with a place and route tool since the cell block unit dimensions correspond to the grid unit dimensions. Using a commercially available place and route software tool (such as place and route tools available from Cadence or Synopsys, for example), a standard cell block is placed on a grid 130 by "floating" the block over the grid and attaching or "snapping" the block to the grid.

Placement of a macro onto a standard cell grid is more challenging because a macro does not necessarily have unit dimensions that correspond to the grid unit dimensions. Unlike a standard cell block, a macro is irregular in shape and does not usually coincide precisely to the dimensions of the underlying standard cell power grid onto which it is placed. In FIG. 3, for example, macros 144 and 146 do not fit precisely within grid lines 132 and 134 as do standard cell blocks 140 and 142.

Figure 4:
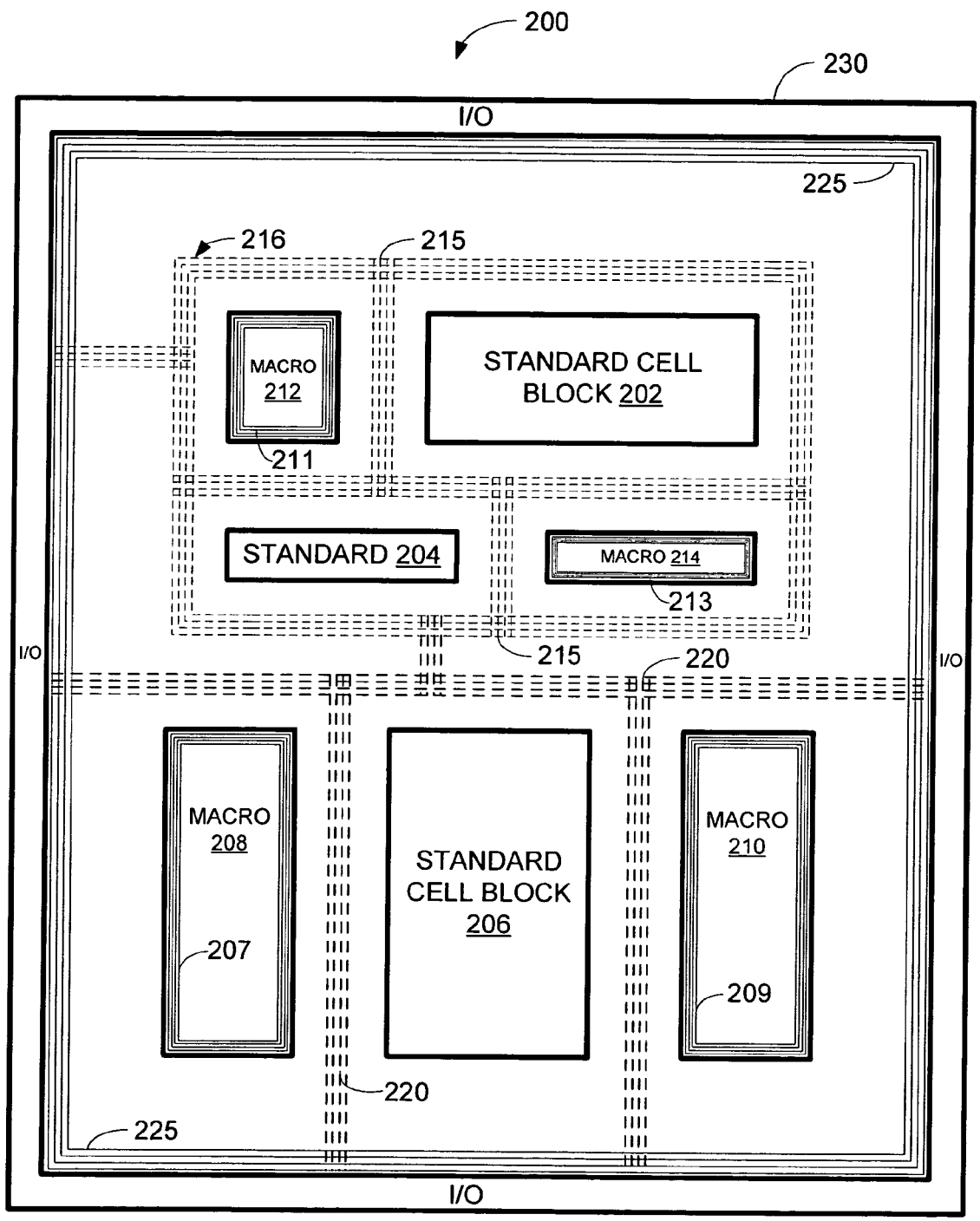
FIG. 4 is a block diagram illustrating a conventional power routing scheme for an integrated circuit.

FIG. 4 is a block diagram illustrating a conventional power routing scheme for a microchip core 200 comprised of multiple standard cell blocks and macros. Standard cell blocks 202, 204 and 206 are formed with power rails (typically, but not always, in the first metal layer), as previously described, and come in pre-defined sizes and have uniform dimensions corresponding to the underlying grid dimensions. They have a regular power and signal pin pattern. Although not illustrated, it is difficult but not impossible to align adjacent standard cell blocks so that they abut and their power/ground rails form a continuous grid. Macros 208, 210, 212 and 214, by contrast, have irregular dimensions and power routing patterns, and may extend well above the first few metal layers. For these reasons, the macros cannot simply be snapped into place alongside the standard cells to form a continuous power grid. This presents a problem where one wishes to utilize both standard cell blocks and macros in one system or core, as illustrated in FIG. 4.

FIG. 4 depicts the conventional solution to this power routing dilemma. While each power bus depicted in FIG. 4 comprises a separate power supply ring and ground ring, in order to simplify illustration they are not separately indicated. Since macros do not typically have a regular power routing or pin pattern, each macro is enclosed in its own power ring or bus to facilitate distribution of power to the macro circuitry components. Hence, macro 208 is enclosed by power bus 207; macro 210 is enclosed by power bus 209; macro 212 is enclosed by power bus 211; and macro 214 is enclosed by power bus 213. These power rings individually enclose and provide power to the circuit components (transistors, diodes, etc.) of each macro. They will typically, but not always, be located in one upper metal layer.

In addition to the rings of power surrounding the simple macros individually, there is typically an additional hierarchical structure of power busses. Fairly wide channels or spacing must be provided between the macros and standard cell blocks to permit the routing of additional power busses. Power bus 215, for example, surrounds the hierarchy comprising standard cell blocks 202 and 204, and macros 212 and 214 to define a complex macro 216. Power bus 220 surrounds macros 208, 210 and standard cell block 206. Finally, a ring of power such as power bus 225 and an I/O ring 230 encloses the entire chip core. The power busses are typically quite wide and distribute power laterally in order to achieve a robust power distribution. In FIG. 4, for example, power is laterally routed from power bus 225 to busses 220 and 215, and then to the macro power rings or standard cell power grids.

This approach to power routing has many drawbacks. The routing methodology was formulated in an era when most processes could be implemented in just a few metal layers. As can be seen in FIG. 4, power is redundantly routed through channels formed between blocks, macros and hierarchies, wasting valuable die space that could either be eliminated or used to accommodate other functions. The typically large widths of the rings of power channeled between blocks, macros, and hierarchies can cause undesirable side effects such as loss of yield, slower signal transition and IR drop. Standard cells cannot typically be located in the area of the power busses, creating low density regions (i.e. regions with much less circuit density relative to other regions of the chip). Macros are often placed in such a way as to introduce discontinuities in the power grid thereby limiting design options.

The present invention employs an approach utilizing a more robustly integrated vertical and lateral power distribution scheme. Macros are wrapped in a power interface ring that interfaces directly to the macro it encloses and to adjacent standard cell power grids in the lower metal layers. The macro power interface ring of the present invention is much narrower than a typical power bus, such as those illustrated in FIG. 4, permitting direct abutment of macros and standard cell blocks, elimination of channels and a consequently significantly reduced microchip core size. The interface ring is sized such that it extends laterally beyond the macro to a multiple of the standard cell snap size (i.e. such that the size of the macro plus the power interface ring corresponds to an integer number of standard cells). An upper power grid is run over the macros in the higher layers of metal and is coupled to the macro power interface ring to provide a robust power distribution network.

Figure 5:
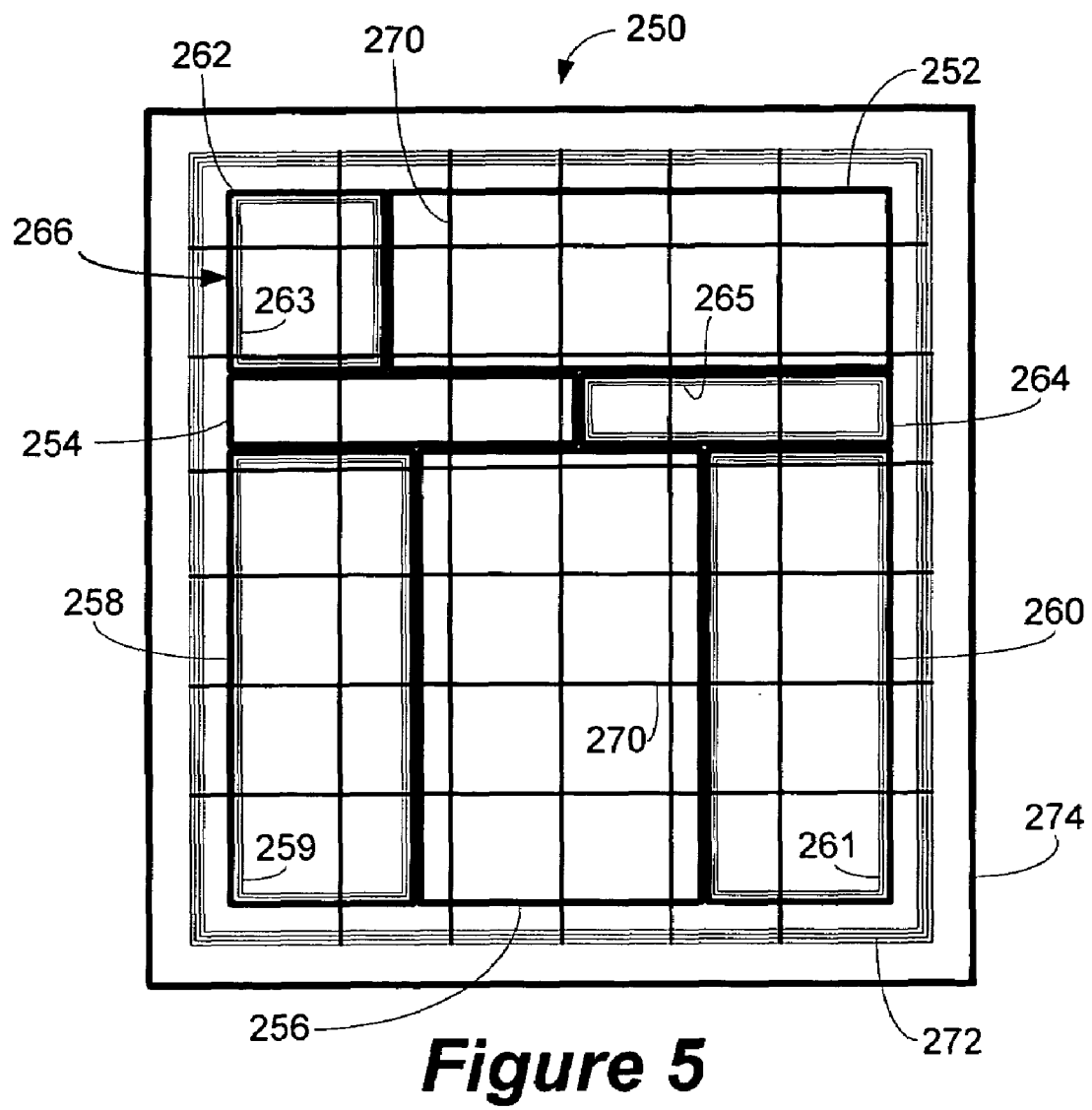
FIG. 5 is a block diagram illustrating a power routing scheme for an integrated circuit according to the present invention.

FIG. 5 is a top level view of a block diagram illustrating a power routing scheme for a microchip core 250 according to the present invention. Again, while each power routing ring or rail depicted in FIG. 5 actually comprises separate power and ground conductors, for sake of simplicity these have not been separately depicted. Microchip core 250 comprises multiple standard cell blocks 252, 254, 256 and macros 258, 260, 262, 264. In order to illustrate the dramatic efficiency and space savings achievable with the power routing configuration of the present invention, standard cell blocks 252, 254, 256 and macros 258, 260, 262, 264 correspond in size and structure to standard cell blocks 202, 204, 206 and macros 208, 210, 212, 214, 216 of microchip core 200 of FIG. 4. Each macro 258, 260, 262, 264 is wrapped, respectively, in an associated macro power interface ring 259, 261, 263, 265. Standard cell blocks 252, 254 and macros 263, 265 define a complex macro 266.

The macro power interface rings extend through all layers of the chip core. The device layers are used for density adjustment and substrate noise reduction. In the lower metal layers (i.e., metal1, metal2), the macro power interface rings connect to the standard cell power grid of adjacent standard cell blocks (i.e., blocks 252, 254, 256) by direct abutment. The macro power interface rings are sized to bring the macro into conformance with the standard cell power grid unit dimensions such that the macros can be easily "snapped" into place alongside (and directly abutting) standard cell blocks. The upper metal layers of the rings are configured as x/y rails that line the perimeter of the macros and connect the rings to an upper power grid 270. Upper power grid 270 is coupled at its periphery to an outer power bus 272 that surrounds the chip core. An external power source (not shown) provides power to bus 272 via appropriate contacts on I/O ring 274. Alternatively, as will be described, upper power grid 270 may be directly coupled to specially formed pads on I/O ring 274, thereby achieving even greater space savings and efficiency. Hence, the macro power interface ring connects the device layers, standard cell power rails, macros and upper power grid to form a robust, compact and vertically stacked power distribution structure.

A visual comparison of FIGS. 4 and 5 makes apparent one tremendous advantage of the present invention. The macro power interface rings are substantially narrower than the power busses previously used to route power. Typically, their width will be in the range of approximately five to twenty times the minimum line size of the semiconductor process. In one embodiment, the lateral width of the macro interface rings is in the range of 1–3 microns. For sake of comparison, 10–50 microns of space are typically allowed for a power bus such as those illustrated in FIG. 4. The reduced sizes of the macro power interface rings result in a routable area savings in an approximate range of 5–25%. The compact nature of the chip core reduces the distance of the I/O ring from the center of the chip, thus minimizing voltage drop and increasing the flexibility of macro placement. Rather than enclosing the macros in redundant and wide power rings, the macro power interface rings are narrow and extend vertically between the lower level standard cell power grid of adjacent cells and an upper power grid. The significant amount of inter-block area previously reserved for channel routing is eliminated, and abutment of standard cell blocks and macros is possible in both x and y directions. As will be described in more detail below, the macro power interface ring is appropriately sized so that the macros align with the power grid dimensions of standard cells.

The use of a narrower macro power interface ring avoids several other problems associated with the use of wider power busses. As previously discussed, the use of wide power busses can create large regions of reduced density since circuitry components cannot be located underneath. A chip core that fully implements narrow macro power interface rings should have no wide power lines present and will largely avoid the above problem. As will be described in more detail herein, for the much smaller low density regions that are created by the narrower macro power interface rings, polycrystalline layers and active body tie rings may be provided to provide density and slot correct blocks. Additionally, where restrictive metal rules for copper cause problems for wide power lines, there is no such impact on the narrower macro power interface rings of the present invention.

Figure 6:
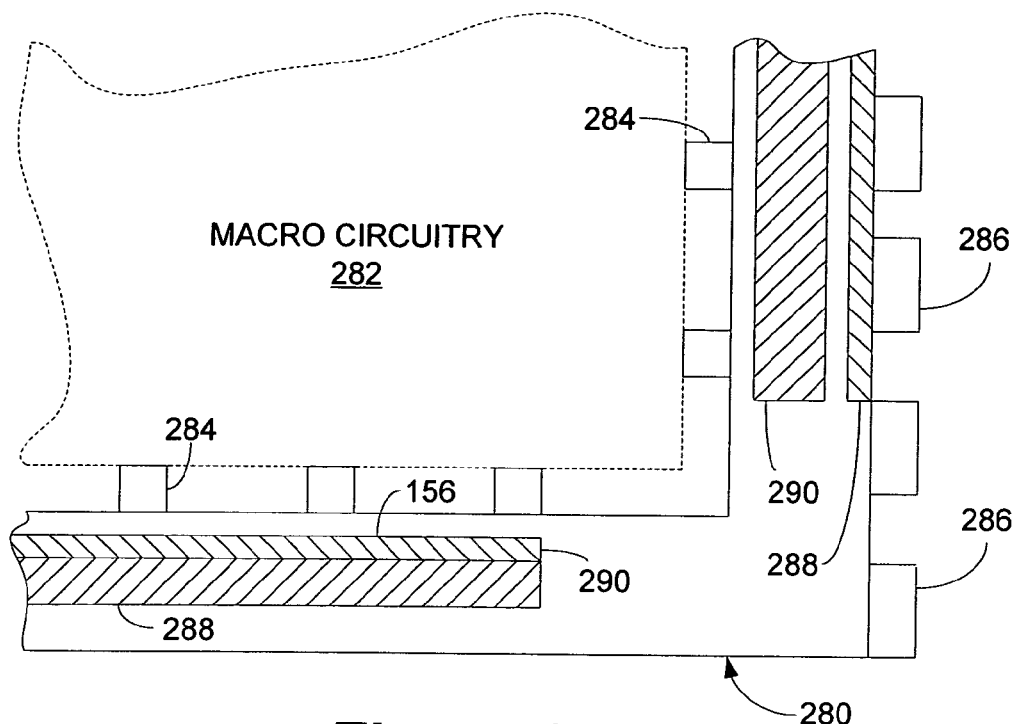
FIG. 6 is an expanded physical diagram of the lower metal layers of a portion of a macro power interface ring according to the present invention.
Figure 7:
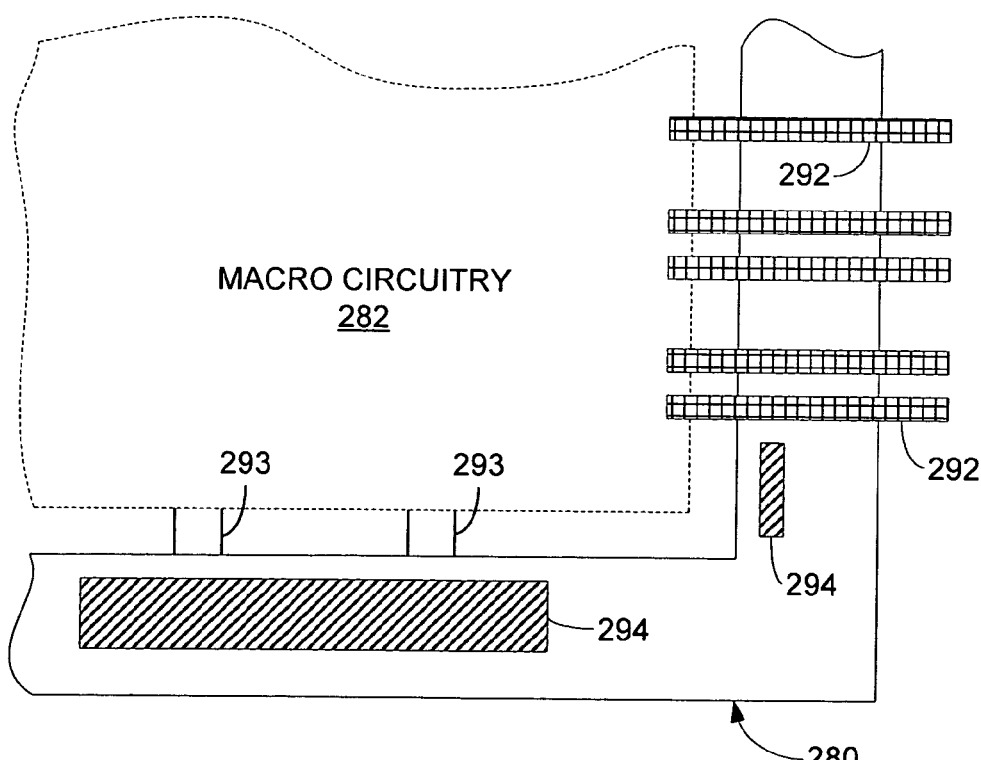
FIG. 7 is an expanded physical diagram of the middle metal layers of a portion of a macro power interface ring according to the present invention.
Figure 8:
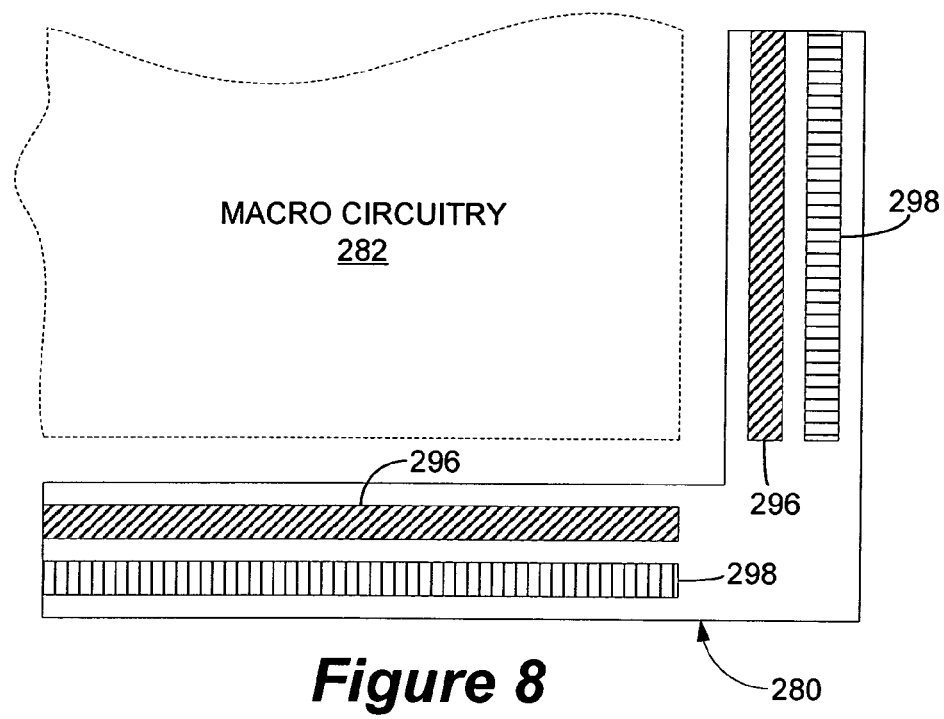
FIG. 8 is an expanded physical diagram of the upper metal layers of a portion of a macro power interface ring according to the present invention.

FIGS. 6–8 illustrate the configuration of one embodiment of a macro power interface ring 280 in more detail. It should be understood that the particular ring configuration illustrated in FIGS. 6–8 is given by way of example only, and that many other configurations embodying the present invention will be apparent to those of ordinary skill in the art.

FIG. 6 is an expanded physical diagram of the lower metal layers of a portion of macro power interface ring 280 according to the present invention. The layers illustrated in FIG. 6 may comprise, for example, the first and second metal layers (metal1 and metal2). Ring 280 includes inner power taps 284 that connect to circuitry or logic within the main body of macro 282. Ring 280 also includes standard cell power taps (typically formed in metal1) for alignment and abutment with the power rails of adjacent standard cell blocks. Ring 280 is sized so that its width and length will be integer multiples of the standard cell width and length, thereby facilitating its easy alignment and placement alongside standard cell blocks, or alongside other macros that have been similarly sized to match standard cell blocks.

Ring 280 also comprises appropriately located active body tie rings 288 that tie the metal layers of ring 280 to the underlying substrate layers. Alternatively, the metal layers may be tied to diodes formed in the substrate layers. As previously mentioned, the presence of a metal power bus, even a much narrower power bus as macro interface ring 280, inherently creates a low density region since circuitry components cannot be located there. In order to raise the density of these regions, polycrystalline features 290 may be provided at appropriate locations.

FIG. 7 is an expanded physical diagram of the middle metal layers of a portion of macro power interface ring 280. The metal layers illustrated in FIG. 7 may comprise, for example, the third and fourth metal layers (metal3 and metal4). Power straps 294 strap the lower portions of ring 280 to the upper portions to provide power distribution throughout all levels of ring 280. In the middle layers of ring 280, openings will typically be provided to allow the routing of signal lines 292 carrying data signals to and from the circuitry components of macro 282. The middle layers of ring 280 may also include power taps 293 to the macro circuitry or logic.

FIG. 8 is an expanded physical diagram of the upper metal layers of a portion of macro power interface ring 280. The metal layers illustrated in FIG. 8 may comprise, for example, the fifth and sixth metal layers (metal5 and metal6). In one embodiment, the upper metal layers of ring 280 comprise power (or VDD) rails 296 and ground (or VSS) rails 298 that line the perimeter of the macro and connect to an upper power grid, such as grid 270 of FIG. 5. In some embodiments, the upper layers of ring 280 may also comprise power taps to the internal macro circuitry, and openings in the ring may be provided in appropriate location to allow routing of signal lines to and from the macro.

Power rails 296 and 298 formed in the upper layers of ring 280 are connected to an upper power grid 270 (FIG. 5). Although grid 270 is illustrated as evenly spaced, this need not always be the case. In practice, there is usually a greater congestion of signals near the center of the chip so it is sometimes best to more closely space the grid near the periphery of the chip and to spread it out near the center to balance density. Where sufficient space and metal layers are available, power grid 270 may cover the entire chip core (as illustrated) and connect at its periphery to an outer power bus 272 that surrounds the chip core. Alternatively, where the chip architecture or available metal layers do not allow a grid that completely covers the chip core, the power grid may cover only its associated macro or a portion of the chip core. In addition to the direct connection to the upper portions of ring 280 (rails 296, 298), it is envisioned that grid 270 could tap power down directly into the interior of the macro.

Figure 9:
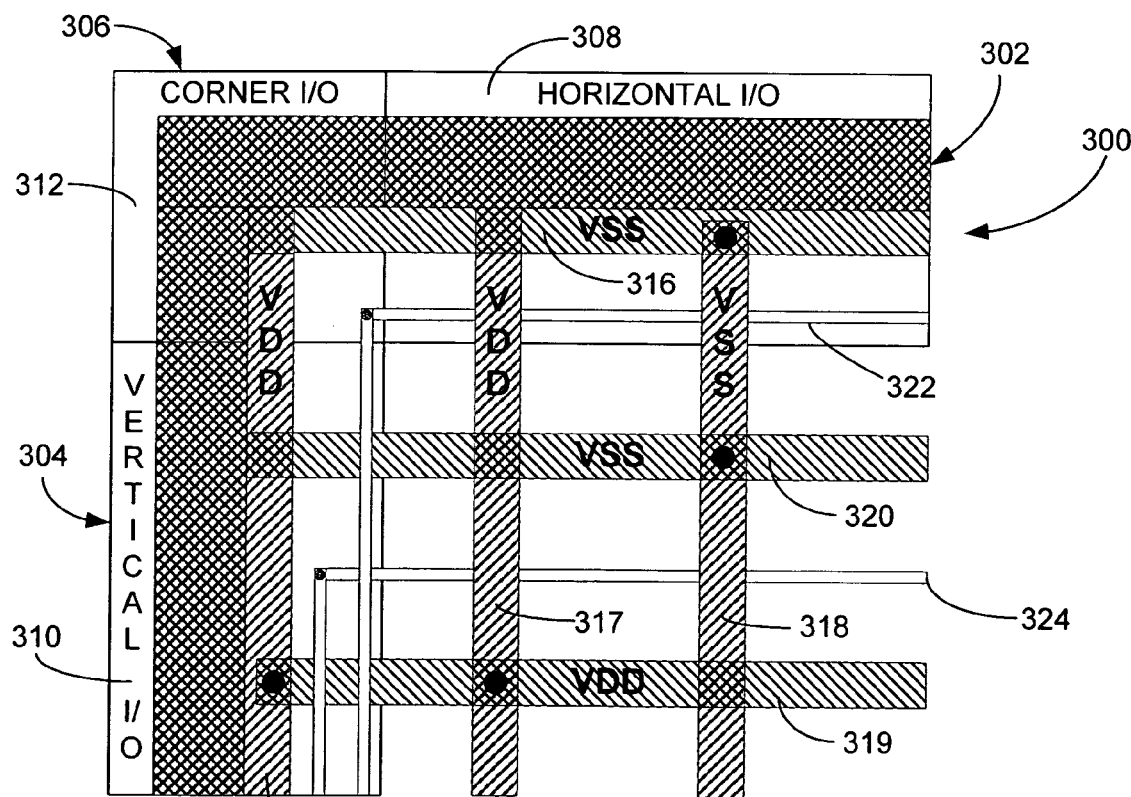
FIG. 9 is an expanded physical diagram illustrating a direct interface between a portion of an I/O ring and an upper power grid according to the present invention.

In another embodiment of the invention, further space savings are achieved by eliminating the outer surrounding power bus and providing a direct interface between the I/O ring power pins and the upper and/or standard cell power grids. FIG. 9 is an expanded physical diagram illustrating a direct interface between a portion of an I/O ring 300 and an upper power grid. I/O ring 300 surrounds a chip core (not shown) comprising macros, standard cell blocks and an inventive power routing scheme including macro power interface rings and an upper power grid as previously described. In this description, I/O ring 300 is discussed in terms of three sections: horizontal I/O ring section 302; vertical I/O ring section 304; and corner I/O ring section 306. Each of I/O ring sections 302, 304, 306 has, respectively, an associated I/O power or bonding pad area 308, 310 and 312. The I/O power pad areas will include bondable areas to which wire bonds can be secured in order to electrically couple the power pad to an external power source or ground.

I/O ring 300 also comprises power (VDD) pin 314 and ground (VSS) pin 316 formed in adjacent upper metal layers. In one possible configuration, as illustrated in FIG. 9, power pin 314 occupies a relatively higher layer such as, for example, metal6; and ground pin 316 occupies a relatively lower layer such as, for example, metal5. Alternate configurations are possible and are within the scope of this invention. Substantial portions of pins 314 and 316 overlap. Importantly, however, a vertically-extending portion of power pin 314 extends beyond ground pin 316 in vertical I/O area 304, and a horizontally-extending portion of ground pin 316 extends beyond power pin 314 in horizontal I/O area 302.

Rather than employing a separate power bus surrounding the chip core, the rails of the upper power grid are directly coupled to the power and ground pins 314, 316 of I/O ring 300. In the illustrated embodiment, the upper power grid occupies two upper metal layers. Alternating vertical power (VDD) rails 317 and vertical ground (VSS) rails 318 are routed in an upper metal layer such as, for example, metal6. Alternating horizontal power (VDD) rails 319 and horizontal ground (VSS) rails 320 are routed in an adjacent upper metal layer such as, for example, metal5. As can be seen, power pin 314 directly abuts power rail 317 in the higher metal layer and is connected by via to power rail 319 in the lower metal layer. Power rails 317 and 319 are also connected by via. Ground pin 316 directly abuts ground rail 320 in the lower metal layer and is connected by via to ground rail 318 in the higher metal layer. Ground rails 318 and 320 are also connected by via.

It should be understood that the precise configuration depicted in FIG. 9 is given by way of example only and that many other configurations are possible. It is not necessary, for example, for horizontal rails to be under the vertical rails, and the rails are not necessarily in directly adjacent layers. Also, while the rails will typically be in upper metal layers, metal5 and metal6 are cited by way of example only. The spacing between the rails of the upper power grid need not be uniform (they may spaced in a fashion to regulate density, for example), and the power/ground rails need not be alternated in a uniform fashion.

To compensate for the loss of routable space caused by elimination of the channel that existed between the chip core and the formerly surrounding power bus, signal lines can be routed in the I/O ring space and in the same metal layers in which the upper power grid is routed. In FIG. 9, for example, vertical signal lines 322 are routed in a relatively higher metal layer and horizontal signal lines 324 are routed in a relatively lower metal layer. With the elimination of the surrounding power bus, macros and standard cells can be placed directly adjacent the surrounding I/O ring, and the ability to route signals under the I/O ring itself provides the necessary room to route signals to and from the macros. Without this ability to route signals under the I/O ring, it would not be possible to place the macros directly adjacent the I/O ring since some space would need to be provided for signal routing.

A similar direct interface may be provided between the I/O ring power pins and the horizontally-extending standard cell power and ground rails in the lower metal layers. In one embodiment, the standard cell power rails directly abut the I/O ring power pin in one metal layer (such as, for example metal1), and a via connection is provided between the I/O ring ground pin and the standard cell ground rails in an adjacent metal layer (such as, for example, metal2).

Figure 10:
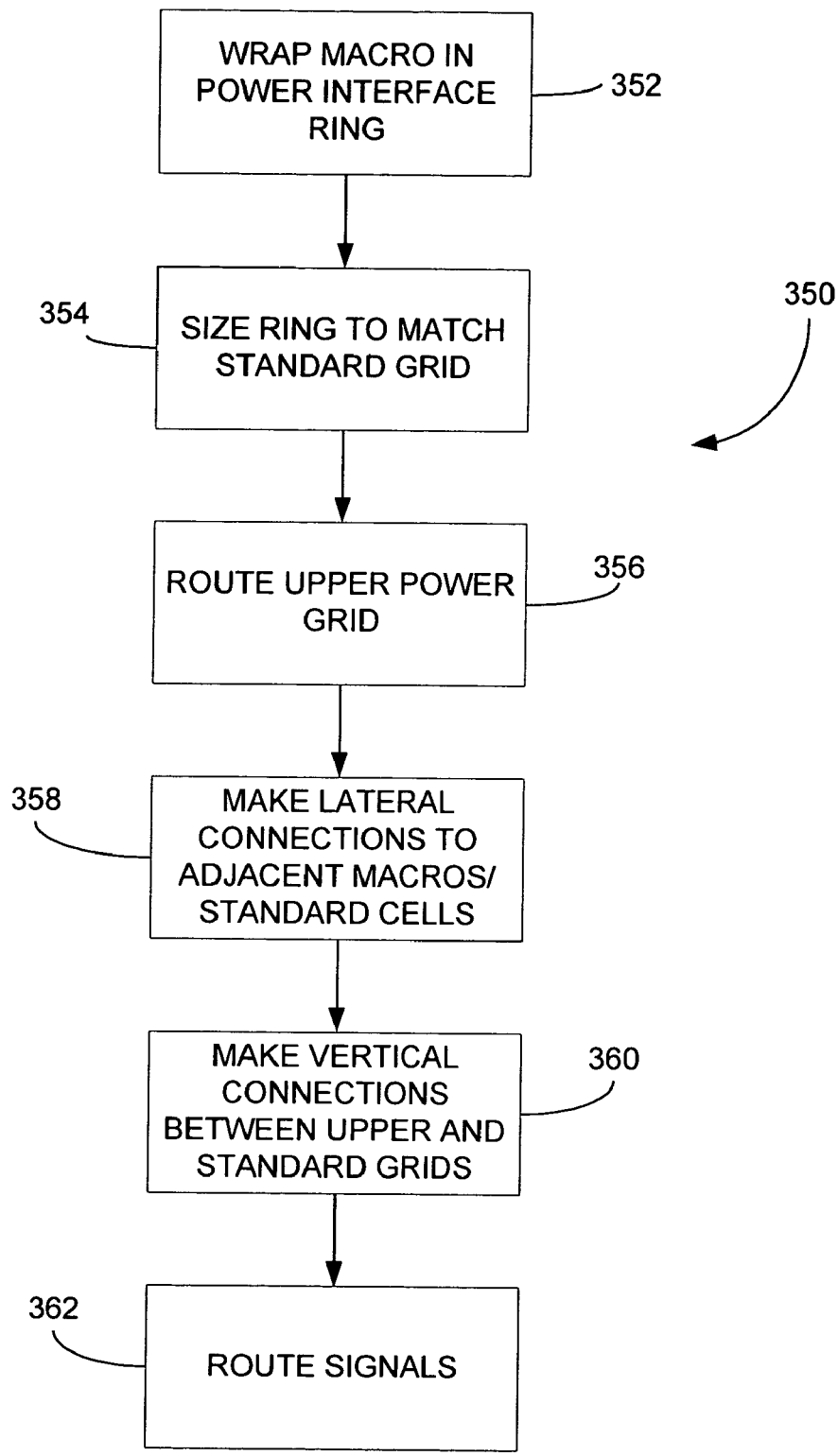
FIG. 10 is a flow chart illustrating a method for efficient power routing in an integrated circuit according to the present invention.

FIG. 10 is a method 350 for efficient integrated circuit power routing according to the present invention. In step 352, a macro is wrapped in a power interface ring. In step 354, the power interface ring is sized so that its dimensions are a multiple of the unit dimensions of a standard cell block power grid, such as grid 130 of FIG. 2. Dummy cells may be used if necessary to achieve the proper sizing. In step 356, the upper power grid is routed and laid out. Preferably, the routing is carried out in a manner to balance density. Since congestion is typically greater near the center of the chip core, for example, the tracks may be laid out with a greater track density at the periphery of the core and a lesser density near the center of the core.

In step 358, lateral connections are made between the power interface ring and adjacent standard cells/macros. This typically occurs in the lower metal layers and may be by direct abutment of the macro interface ring with the standard cell power grid. It is important to note that connections may be made to adjacent macros/power interface rings that have also been sized to the dimension multiples of a standard cell. In step 360, vertical connections are made between the upper power grid and standard grid. This is typically carried out by connecting the upper layers of the power interface ring to the upper power grid rails. Finally, in step 362, signals are routed. As previously described, in one embodiment, signals may be routed within the I/O ring space.

While various embodiments of the invention have been described, it will be apparent to those of ordinary skill in the art that many more embodiments and implementations are possible that are within the scope of this invention. Moreover, while the present invention has been described primarily with reference to "standard cells" and "macros", this has been done for the sole purpose of illustrating a particular embodiment of the invention. The invention is not limited by this choice of terminology, and it should be understood that the invention may be employed to improve power routing in circuit blocks in general and is not limited to use in conjunction with macros, standard cells or any other types of circuit block.

What is claimed is:

1. An integrated circuit having a plurality of conductive layers formed above device layers and comprising:
   a first circuit block having circuitry components formed in the device layers and spaced power rails;
   a second circuit block disposed adjacent the first block and surrounded by a power interface ring formed with power taps that directly abut the power rails of the adjacent first block to facilitate power routing between the first and second blocks; and
   a power grid formed in one or more metal layers and connected to the power interface ring to facilitate power routing to the first and second blocks.

2. An integrated circuit as claimed in claim 1, wherein the first circuit block is a standard cell block and the second circuit block is a macro.

3. An integrated circuit as claimed in claim 1, wherein the power rails in the first circuit block are uniformly spaced and are formed in lower metal layers.

4. An integrated circuit as claimed in claim 1, wherein the power interface ring extends from the device layers to upper metal layers.

5. An integrated circuit as claimed in claim 1, wherein the power grid is formed in upper metal layers.

6. An integrated circuit as claimed in claim 1, wherein the power grid is directly connected to power pins in a surrounding I/O ring, and wherein data signals are routed in the space typically occupied by the I/O ring.

7. An integrated circuit having lower conductive layers and upper conductive layers formed above device layers and comprising:
   a standard cell block having circuitry components formed in the device layers and uniformly spaced power rails formed in the lower metal layers;
   a macro disposed adjacent the standard cell block and surrounded by a power interface ring that extends from the device layers to the upper metal layers, wherein the power interface ring is formed with power taps that directly abut the power rails of the adjacent standard cell block in the lower metal layers to facilitate power routing between the macro and standard cell block; and
   a power grid formed in the upper metal layers and being connected to the power interface ring to facilitate power routing to the standard cell block and macro.

8. An integrated circuit as claimed in claim 7, wherein the power interface ring has a relatively narrow lateral width.

9. An integrated circuit as claimed in claim 8, wherein the power interface ring has a lateral width in the range of approximately one to three microns.

10. An integrated circuit as claimed in claim 8, wherein the power interface ring has a lateral width in the range of five to twenty times the minimum line size of the semiconductor process.

11. An integrated circuit as claimed in claim 7, wherein the power interface ring is formed with active body ties that tie the lower metal layers of the power interface ring to the substrate layers or to diodes formed in the substrate layers.

12. An integrated circuit as claimed in claim 7, wherein the power interface ring is formed with polycrystalline features.

13. An integrated circuit as claimed in claim 7, wherein the upper metal layers of the power interface ring are formed with horizontal and vertical conductors that are tied to the upper power grid.

14. An integrated circuit as claimed in claim 7, wherein the power grid formed in the upper metal layers covers the entire integrated circuit and is connected at its periphery to a power bus surrounding the integrated circuit.

15. An integrated circuit as claimed in claim 7, wherein the power grid formed in the upper metal layers covers the entire integrated circuit and is directly connected at its periphery to power pins formed in an I/O ring at least partially surrounding the integrated circuit.

16. An integrated circuit as claimed in claim 15, wherein signals are routed within the space typically occupied by the I/O ring.

17. An integrated circuit as claimed in claim 7, wherein the power grid formed in the upper metal layers covers only the macro and not the entire integrated circuit.

* * * * *